(12) United States Patent
Chen et al.

(10) Patent No.: US 12,198,061 B2
(45) Date of Patent: Jan. 14, 2025

(54) METHOD AND APPARATUS FOR PREDICTING YIELD OF SEMICONDUCTOR DEVICES

(71) Applicant: SHANGHAI HUALI INTEGRATED CIRCUIT CORPORATION, Shanghai (CN)

(72) Inventors: Shanshan Chen, Shanghai (CN); Hunglin Chen, Shanghai (CN); Yin Long, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 881 days.

(21) Appl. No.: 17/351,975

(22) Filed: Jun. 18, 2021

(65) Prior Publication Data

US 2022/0172070 A1 Jun. 2, 2022

(30) Foreign Application Priority Data

Nov. 27, 2020 (CN) .......................... 202011357825.0

(51) Int. Cl.
| | |
|---|---|
| G06N 3/088 | (2023.01) |
| G06F 18/214 | (2023.01) |
| G06F 18/2411 | (2023.01) |
| G06N 3/044 | (2023.01) |
| G06N 3/045 | (2023.01) |

(Continued)

(52) U.S. Cl.
CPC ............ *G06N 3/088* (2013.01); *G06F 18/214* (2023.01); *G06F 18/2411* (2023.01); *G06N 3/044* (2023.01); *G06N 3/045* (2023.01); *G06N 3/084* (2013.01); *G06N 20/10* (2019.01); *H01L 22/20* (2013.01)

(58) Field of Classification Search
CPC ........ G06N 3/088; G06N 3/044; G06N 20/10; G06N 3/084; G06N 3/045; H01L 22/20; G06F 18/214; G06F 18/2411
See application file for complete search history.

(56) References Cited

U.S. PATENT DOCUMENTS

| 10,650,508 B2 * | 5/2020 | Chang ..................... G06F 18/28 |
| 2019/0286983 A1 * | 9/2019 | Jung ......................... G06N 3/04 |

OTHER PUBLICATIONS

An et al., NPL ("A Semiconductor Yields Prediction Using Stepwise Support Vector Machine" Published 2009 by IEEE pp. 130-136 (Year: 2009).*

* cited by examiner

*Primary Examiner* — Quoc A Tran
(74) *Attorney, Agent, or Firm* — Banner & Witcoff, Ltd.

(57) ABSTRACT

A method for predicting the yield of manufacturing semiconductor devices includes steps of: acquiring defect data of semiconductor devices to be predicted, wherein the semiconductor devices to be predicted include finished semiconductor devices and semi-finished semiconductor devices, and the defect data indicates a defect type and location of at least one defect of the semiconductor devices; inputting the defect data into a pre-trained yield prediction model, wherein the yield prediction model includes a neural network structure and a classification structure, the neural network structure is used to extract defect feature vectors from the defect data, and the classification structure is used to output classification results of qualified or unqualified yield according to the defect feature vectors; and determining, by the yield prediction model, classification results of qualified or unqualified yield of the semiconductor devices.

19 Claims, 5 Drawing Sheets

(51) Int. Cl.
*G06N 3/084* (2023.01)
*G06N 20/10* (2019.01)
*H01L 21/66* (2006.01)

METHOD AND APPARATUS FOR PREDICTING YIELD OF SEMICONDUCTOR DEVICES

CROSS-REFERENCES TO RELATED APPLICATIONS

This application claims the priority to Chinese patent application No. CN202011357825.0, filed on Nov. 27, 2020, and entitled "METHOD AND APPARATUS FOR PREDICTING YIELD OF SEMICONDUCTOR", the disclosure of which is incorporated herein by reference in its entirety.

TECHNICAL FIELD

The present disclosure relates to a process managing technology for manufacturing semiconductor devices, in particular to a method for predicting the yield of manufacturing semiconductor devices and an apparatus for predicting the yield of manufacturing semiconductor devices.

BACKGROUND

With the increasing complexity of chip design, it is has become more difficult to put new chip designs into production. Chip manufacturers are looking for ways to speed up product launches and achieve the best yields they can. Mass data results show that production line defects directly affect the yields of chip products. Therefore, it is particularly important to monitor production line defects and efficiently analyze causes of defects.

The existing production line defect monitoring techniques are to monitor different hierarchical structures and different defect types of semiconductor devices by reviewing trend charts daily, so as to issue defect notice highlight signals to alert when the defect rate is high. However, for some lot wafers that are not reviewed after scanning, or defects on the same wafer that are not sampled for review, the existing production line defect monitoring technology may have the problem of underreporting defects, which will affect the estimation of chip probing yield. In addition, for some lot wafers with a tight production period or a short Q-Time between two processes, the existing production line defect monitoring technology may directly skip them and scan next lot wafer, or does not scan the defects of these lot wafers, which will affect the estimation of chip probing yield.

Therefore, in order to overcome the above existing shortcomings, a yield prediction technique for manufacturing semiconductor devices is urgently needed in the art to accurately and efficiently predict the defects and yield of manufacturing semiconductor devices.

BRIEF SUMMARY

A brief summary of one or more embodiments is given below to provide a basic understanding of the invention. This summary is not an exhaustive overview of all aspects conceived, and is neither intended to identify the key or decisive elements of all aspects nor intended to define the scope of any or all aspects. Its sole purpose is to present some concepts of one or more aspects in a simplified form as a prelude to the more detailed description given later.

To overcome the above shortcomings in the current technology, the present disclosure provides a method and an apparatus for predicting yield of manufacturing semiconductor devices, yield of manufacturing semiconductor devices and a computer-readable storage medium, for accurately and efficiently predicting defects and yield of manufacturing semiconductor devices.

The method for predicting the yield of manufacturing semiconductor devices according to the present disclosure includes steps of: acquiring defect data of semiconductor devices to be predicted, wherein the semiconductor devices to be predicted include finished semiconductor devices and semi-finished semiconductor devices, and the defect data indicates a defect type and location of at least one defect of the semiconductor devices; inputting the defect data into a pre-trained yield prediction model, wherein the yield prediction model includes a neural network structure and a classification structure, the neural network structure is used to extract defect feature vectors from the defect data, and the classification structure is used to output classification results of qualified or unqualified yield according to the defect feature vectors; and determining, by the yield prediction model, classification results of qualified or unqualified yield of the semiconductor devices.

Preferably, in some embodiments of the present disclosure, the yield predicting method may further include steps of: acquiring sample defect data and sample yield data of a plurality of semiconductor device samples, wherein the sample defect data indicates a defect type and location of at least one defect of the semiconductor device samples, and the sample yield data indicates whether the yield of the semiconductor device samples is qualified; and training the yield prediction model with the sample defect data as input information and the sample yield data as output information.

Preferably, in some embodiments of the present disclosure, the step of training the yield prediction model may include: training each neural network layer of a pre-training structure without supervision, using the sample defect data of the plurality of semiconductor device samples as input information of a first neural network layer of the pre-training structure and output information of a last neural network layer of the pre-training structure, to ensure that each neural network layer maps feature information to a next neural network layer as much as possible; and removing at least the last neural network layer of the pre-training structure to obtain the neural network structure, wherein the neural network structure includes a plurality of neural network layers.

Preferably, in some embodiments of the present disclosure, each neural network layer may include at least one mutually independent neuron. Each neuron is adapted to calculate corresponding output information according to its input information and synaptic weight, and input the output information to each neuron of the next neural network layer. The output information may be a continuous nonlinear function of the input information and the synaptic weight. The step of training each neural network layer of the pre-training structure may include: training the synaptic weight of each neuron according to the input information and output information of the neuron of each neural network layer to train the neural network.

Optionally, in some embodiments of the present disclosure, the pre-training structure may include a plurality of front neural network layers and a plurality of back neural network layers. Dimensions of the plurality of front neural network layers are reduced layer by layer. Dimensions of the plurality of back neural network layers are increased layer by layer. The step of obtaining the neural network structure may include: removing the plurality of back neural network layers, and using the plurality of front neural network layers as the neural network structure.

Optionally, in some embodiments of the present disclosure, the classification structure may include a support vector machine structure. The support vector machine structure is adapted to determine a hyperplane that can divide all data of the defect feature vectors, so as to realize the classification of the defect feature vectors. The hyperplane makes distances between all the data of the defect feature vectors and the hyperplane the shortest.

Preferably, in some embodiments of the present disclosure, the support vector machine (SVM) structure may include an SVM network. The SVM network is configured behind the last neural network layer of the neural network structure to form the yield prediction model. The step of training the yield prediction model may include: reversely training the plurality of neural network layers of the neural network structure with supervision, using the defect feature vectors outputted by the last neural network layer as input information of the SVM network and the sample yield data as output information of the SVM network, to finely adjust the yield prediction model.

Preferably, in some embodiments of the present disclosure, the step of training the yield prediction model may further include: determining abnormal points outputted by the finely adjusted yield prediction model according to a baseline fail bin count at a normal level of a long-term trend chart; removing data of the abnormal points from the sample defect data, and performing null filling on data locations of the abnormal points with an average value of defects of multiple lots of adjacent samples; and adjusting a penalty coefficient, a gamma value and/or a weight of the support vector machine structure according to the accuracy, detection rate and error report rate of the abnormal points to optimize the yield prediction model.

Optionally, in some embodiments of the present disclosure, the step of acquiring sample defect data of the plurality of semiconductor device samples may include: screening multiple lots of semiconductor device samples on a production line according to a key layer to select multiple lots of typical semiconductor device samples, wherein the key layer is determined by the location of at least one defect that has a high yield influencing weight, each lot of semiconductor device samples includes a plurality of wafers, and each wafer includes a multi-layer structure; screening the multiple lots of typical semiconductor device samples to select a plurality of typical wafers; performing defect analysis on the plurality of typical wafers to determine at least one defect of each typical wafer; and counting the defect type and location of the at least one defect of each typical wafer, to determine the sample defect data of the multiple lots of typical semiconductor device samples.

Preferably, in some embodiments of the present disclosure, the step of acquiring sample defect data of the plurality of semiconductor device samples may further include: screening the defects of the multiple lots of semiconductor device samples according to the yield influencing weights of defects of various defect types to determine types of killer defects; screening the defects of the multiple lots of semiconductor device samples according to the yield influencing weights of defects at respective locations to determine the key layer; and screening the sample defect data of the multiple lots of semiconductor device samples according to the types of killer defects and the key layer to determine optimized sample defect data.

Optionally, in some embodiments of the present disclosure, the yield predicting method may further include a step of: in response to the missing of sample defect data of any semiconductor device sample, calling an average value of multiple adjacent layers of sample defect data to perform missing data optimization algorithm on the missing sample defect data, wherein the adjacent includes temporal adjacent and location adjacent.

Optionally, in some embodiments of the present disclosure, the neural network structure may include a plurality of neural network layers. Each of the neural network layers can be trained without supervision to ensure that feature information is mapped to a next neural network layer as much as possible. The step of determining the classification results includes: inputting the defect data of the semiconductor devices to the first neural network layer of the neural network structure; mapping feature information of the defect data to the next neural network layer as much as possible by the first neural network layer, and sequentially mapping the feature information backwards till the last neural network layer of the neural network structure; and inputting the defect feature vectors outputted by the last neural network layer to the classification structure to determine the classification results by the classification structure.

Preferably, in some embodiments of the present disclosure, each neural network layer may include at least one mutually independent neuron. The step of mapping the defect data to the next neural network layer may include: calculating output information of each neuron according to the input information and synaptic weight of each neuron of the current neural network layer, wherein the output information is a continuous nonlinear function of the input information and synaptic weight of the corresponding neuron; and inputting the output information of each neuron to each neuron of the next neural network layer to map the defect data backwards.

Optionally, in some embodiments of the present disclosure, dimensions of the plurality of neural network layers of the neural network structure are reduced layer by layer. The step of inputting the defect feature vectors to the classification structure may include: inputting the lowest-dimensional defect feature vectors outputted by the last neural network layer to the classification structure.

Optionally, in some embodiments of the present disclosure, the classification structure may include a support vector machine structure. The step of determining the classification results may include: determining, by the support vector machine structure, a hyperplane that can divide all data of the defect feature vectors, to realize the classification of the defect feature vectors, wherein the hyperplane can make distances between all the data of the defect feature vectors and the hyperplane the shortest.

Preferably, in some embodiments of the present disclosure, the support vector machine structure may include an SVM network. The SVM network may be configured behind the last neural network layer of the neural network structure to form the yield prediction model, for reversely training the plurality of neural network layers of the neural network structure with supervision to finely adjust the yield prediction model. The step of determining the classification results may further include: inputting the defect feature vectors outputted by the last neural network layer to the SVM network, so as to determine the classification results of qualified or unqualified yield of the semiconductor devices by the SVM network.

Preferably, in some embodiments of the present disclosure, the step of determining the classification results may further include: inputting the defect feature vectors to the optimized yield prediction model, so as to determine the classification results by the optimized yield prediction model according to the optimized penalty coefficient, gamma value and/or weight, wherein the optimized yield prediction model is optimized according to abnormal points determined by a baseline fail bin count at a normal level of a long-term trend chart, and the optimized penalty coefficient, gamma value and/or weight are adjusted according to the accuracy rate, detection rate and error report rate of the abnormal points outputted by the yield prediction model.

According to another aspect of the present disclosure, an apparatus for predicting the yield of manufacturing semiconductor devices is further provided herein.

The apparatus for predicting the yield of manufacturing semiconductor devices according to the present disclosure includes a memory and a processor. The processor is connected to the memory and is configured to implement the method for predicting the yield of manufacturing semiconductor devices according to any one of the above embodiments, so as to accurately and efficiently predict the defects and yield of the semiconductor devices.

According to another aspect of the present disclosure, a computer-readable storage medium is further provided herein.

The computer-readable storage medium according to the present disclosure stores computer instructions thereon. The computer instructions are executed by the processor to implement the method for predicting the yield of manufacturing semiconductor devices according to any one of the above embodiments, so as to accurately and efficiently predict the defects and yield of the semiconductor devices.

BRIEF DESCRIPTION OF THE DRAWINGS

After reading the detailed description of the embodiments of the present disclosure in conjunction with the following drawings, the above-mentioned features and advantages of the present disclosure can be better understood. In the drawings, components are not necessarily drawn to scale, and the components with similar related characteristics or features may have the same or similar reference numerals.

DETAILED DESCRIPTION OF THE DISCLOSURE

Figure 1:
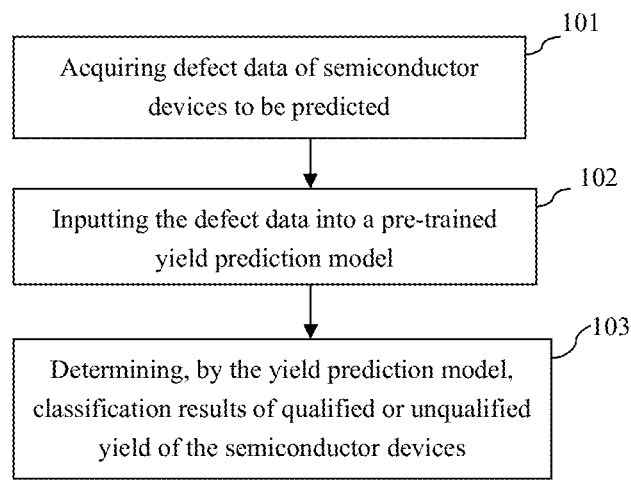
FIG. 1 shows a schematic flowchart of a method for predicting the yield of manufacturing semiconductor devices according to an aspect of the present disclosure.

The following specific examples illustrate the embodiments of the present disclosure, and those skilled in the art can easily understand other advantages and effects of the present disclosure from the content disclosed in this specification. Although the description of the present disclosure will be introduced in conjunction with preferred embodiments, this does not mean that the features of the present disclosure are limited to the embodiments. On the contrary, the purpose of introducing the invention in conjunction with the embodiments is to cover other options or modifications that may be extended based on the claims of the present disclosure. In order to provide an in-depth understanding of the present disclosure, many specific details will be included in the following description. The present disclosure may also be implemented without using these details. In addition, in order to avoid confusion or obscuring the focus of the present disclosure, some specific details will be omitted in the description.

In the description of the present disclosure, it should be noted that, unless otherwise specified and defined, the terms "mounted", "coupled" and "connected" should be generally understood, for example, the "connected" may be fixedly connected, detachably connected, integrally connected, mechanically connected, electrically connected, directly connected, or connected by a medium, or communicated for the interiors of two elements. For those of ordinary skill in the art, the specific meanings of the terms mentioned above in the present disclosure should be construed according to specific circumstances.

In addition, "upper", "lower", "left", "right", "top", "bottom", "horizontal", and "vertical" used in the following description should be understood as orientations described in this paragraph and relevant drawings. The relative terms are only for the convenience of description, they do not mean that the apparatus described needs to be manufactured or operated in a specific orientation, and therefore should not be construed as limitations to the present disclosure.

It can be understood that although the terms "first", "second", "third", etc. may be used herein to describe various components, regions, layers and/or parts, these components, regions, layers and/or parts should not be limited by these terms, and these terms are only used to distinguish different components, regions, layers and/or parts. Therefore, the first component, region, layer and/or part discussed below may be referred to as a second component, region, layer and/or part without departing from some embodiments of the present disclosure.

As mentioned above, the existing production line defect monitoring technology is carried out by reviewing trend charts every day, which has the problem of easily missing defects. Therefore, the estimation accuracy of the Capability of Process Index (CP) yield is relatively low.

The present disclosure provides a method for predicting the yield of manufacturing semiconductor devices, an apparatus for predicting the yield of manufacturing semiconductor devices, and a computer-readable storage medium, for accurately and efficiently predicting the defects and yield of the semiconductor devices.

In some non-limiting embodiments, the method for predicting the yield of manufacturing semiconductor devices according to the present disclosure may be implemented by an apparatus for predicting the yield of manufacturing semiconductor devices. Specifically, the yield predicting apparatus may include a memory and a processor. The memory may include a computer-readable storage medium, storing computer instructions thereon. The processor may be connected to the memory and is adapted to execute the computer instructions stored on the memory to implement the above-mentioned method for predicting the yield of manufacturing semiconductor devices, so as to accurately and effectively predict the defects and yield of the semiconductor devices.

Hereinafter, the method for predicting the yield of manufacturing semiconductor devices will be described in conjunction with some embodiments using the yield predicting apparatus to predict the yield of manufacturing semiconductor devices. Those skilled in the art could understand that these embodiments using the yield predicting apparatus to implement the yield predicting method are just some non-limiting embodiments provided by the present disclosure, which are intended to clearly demonstrate the main concept of the present disclosure and provide some specific schemes for the public to implement, and are not used to limit the protection scope of the present disclosure.

Refer to FIG. 1, which shows a schematic flowchart of a method for predicting the yield of manufacturing semiconductor devices according to an aspect of the present disclosure.

As shown in FIG. 1, the method for predicting the yield of manufacturing semiconductor devices according to the present disclosure may include step 101: acquiring defect data of semiconductor devices to be predicted.

Predicting semiconductor manufacturing yield may include acquiring finished semiconductor devices post production, or semi-finished semiconductor devices that have only undergone a part of the production process. With regard to the finished semiconductor devices that have been produced, the processor of the yield predicting apparatus can acquire measured defect data from a production line and input the defect data into a pre-trained yield prediction model to predict whether the finished products can meet yield standards required by customers, thereby increasing the qualification rate of manufactured products. With regard to the semi-finished semiconductor devices that have not been completely produced, the processor of the yield predicting apparatus can acquire defect data that has been formed on the semi-finished products in real time from a production line, and input the defect data into a pre-trained yield prediction model to predict whether semiconductor devices prepared from the semi-finished products can meet yield standards required by customers, so as to stop further processing of substandard semi-finished products in time to reduce costs.

The defects include, but are not limited to, any defects and features that cause loss of yield, such as an MBIST fail SRAM region under high voltage of an MBIST-HV-fail bin. These defects can be measured by detectors of the production line to form corresponding defect data. The defect data may indicate a defect type and hierarchical location of at least one defect of the semiconductor devices. The hierarchical location indicates which layer of a wafer the defect is located.

As shown in FIG. 1, the method for predicting the yield of manufacturing semiconductor devices according to the present disclosure may further include step 102: inputting the defect data into a pre-trained yield prediction model.

The yield prediction model includes a neural network structure and a classification structure, and the model needs to be pre-trained to learn about the function of predicting the yield of the semiconductor devices. Specifically, the neural network structure is adapted to extract defect feature vectors $h_{w,b}(x)$ from the input defect data according to pre-trained learning parameters w and b. The classification structure is adapted to output, according to the extracted defect feature vectors $h_{w,b}(x)$, classification results indicating that the yield is qualified or unqualified.

Figure 2:
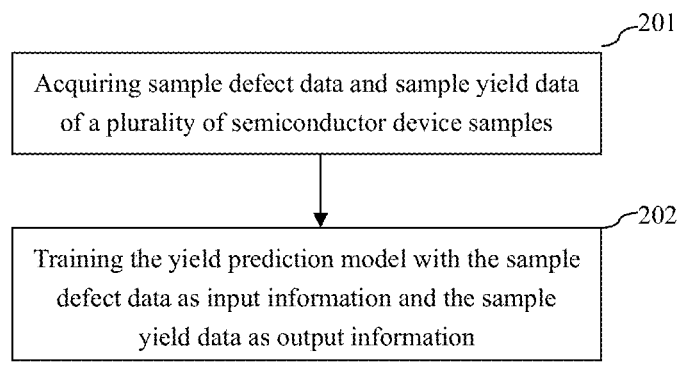
FIG. 2 shows a schematic flowchart of training a yield prediction model according to some embodiments of the present disclosure.

Refer to FIG. 2, which shows a schematic flowchart of training a yield prediction model according to some embodiments of the present disclosure.

As shown in FIG. 2, in some embodiments of the present disclosure, a method for training a yield prediction model may include step 201: acquiring sample defect data and sample yield data of a plurality of semiconductor device samples.

The semiconductor device samples may be selected from a plurality of semiconductor devices previously produced from the same production line as the semiconductor devices to be predicted, so that the semiconductor device samples and the semiconductor devices to be predicted have similar production line defects. In some embodiments, a trainer of the yield prediction model may acquire historical data of 10,000 wafer samples from a data source 0025D as sample data for training the yield prediction model (see Table 1).

The sample defect data may indicate a defect type and hierarchical location of at least one defect of the semiconductor device samples. In some embodiments, the trainer of the yield prediction model may perform defect scanning on the 10,000 wafer samples to determine 150 common defect types therein. In some embodiments, the data format of the sample defect data may be the same as that of the defect data of the semiconductor devices to be predicted, so that the neural network structure extracts the same type of defect feature vectors $h_{w,b}(x)$.

The sample yield data may indicate the types, number and hierarchical locations of defects in the semiconductor device samples that may cause loss of yield, and indicate whether the yield of the semiconductor device samples is qualified, so that the classification structure classifies the extracted defect feature vectors $h_{w,b}(x)$. In some embodiments, the trainer of the yield prediction model may select a parameter (BinG) of parameter (MBIST_CFG_NON_BTFM_HV_FAIL) as the sample yield data to indicate whether the yield of the semiconductor device samples is qualified.

In some preferred embodiments, the trainer of the yield prediction model may screen multiple lots of semiconductor device samples on the production line according to the number of key layers in each lot of semiconductor device samples to select multiple lots of typical semiconductor device samples for training the yield prediction model. Each lot of semiconductor device samples may include a standard quantity of wafers, such as 25 wafers per container lot. Each wafer may include a semiconductor structure of dozens of layers. The key layer may be determined by a hierarchical location of at least one defect that has a high weight of influencing the yield. That is, if there is one or more defects that have high weights of influencing the yield on a semiconductor structure layer, this semiconductor structure layer can be defined as a key layer. In some embodiments, if the number of key layers in a lot of semiconductor device samples reaches about 20 layers, the semiconductor device samples can be regarded as typical semiconductor device samples.

Next, the trainer of the yield prediction model may further screen the multiple lots of typical semiconductor device samples to select a plurality of wafers with scan layers close to or more than 20 layers as typical wafers for defect data analysis, so to determine at least one defect of each typical wafer. In some embodiments, the trainer of the yield prediction model may select the first wafer and the twenty-fourth wafer of each lot of typical semiconductor device samples as typical wafers for defect scanning and data analysis. Then, the trainer of the yield prediction model may perform statistics on the defect type and hierarchical location of at least one defect of each typical wafer to determine sample defect data of the multiple lots of typical semiconductor device samples.

Furthermore, the trainer of the yield prediction model may further screen the defects of the multiple lots of semiconductor device samples according to the weights of various defect types influencing the yield to determine types of killer defects. In addition, the trainer of the yield prediction model may further screen the defects of the multiple lots of semiconductor device samples according to the weights of the defects at respective hierarchical locations that influence the yield to determine the key layers in the multi-layer hierarchical structure. After that, the trainer of the yield prediction model may further screen the sample defect data from the multiple lots of semiconductor device samples according to the types of killer defects and the key layers to determine optimized sample defect data. By screening the types of killer defects and the key layers, the optimized sample defect data has a higher weight for influencing the yield, and has a higher singleness of defect types, which is beneficial to improving the accuracy of yield prediction.

Figure 3:
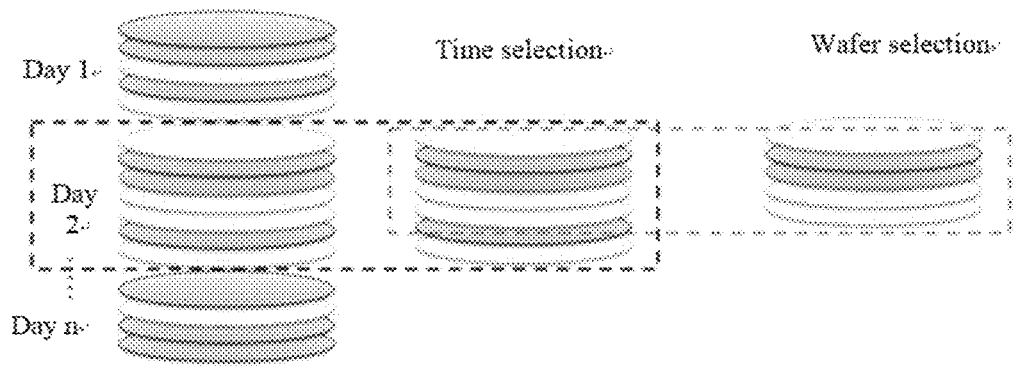
FIG. 3 shows a schematic sequence of performing missing data algorithm optimization according to some embodiments of the present disclosure.

Refer to FIG. 3, which shows a schematic sequence of performing missing data algorithm optimization according to some embodiments of the present disclosure.

As shown in FIG. 3, when the sample defect data of any semiconductor device sample is missing, the trainer of the yield prediction model may call an average value of multiple adjacent layers of sample defect data to perform missing data algorithm optimization on the missing sample defect data. In some embodiments, the trainer of the yield prediction model may call an average value of sample defect data of hierarchical structures prepared within a period of time adjacent to the missing data to perform optimization algorithm of the missing data. Optionally, in some other embodiments, the trainer of the yield prediction model may also call an average value of sample defect data of multiple lots of semiconductor device samples adjacent to the missing data to perform optimization algorithm of the missing data.

Those skilled in the art can understand that the above training process of the yield prediction model is only a general description, and is not used to limit the executor of the method for performing the yield prediction model training. In some embodiments, the trainer of the yield prediction model may include a training person. Optionally, in some other embodiments, the trainer of the yield prediction model may also include a processor or a controller to execute the training method.

As shown in FIG. 2, in some embodiments of the present disclosure, the method for training the yield prediction model may further include step 202: training the yield prediction model, using the sample defect data as input information and the sample yield data as output information.

As mentioned above, the yield prediction model may include a neural network structure and a classification structure. In some embodiments, the neural network structure may be trained by unsupervised learning to ensure that each neural network layer maps feature information of this layer to a next neural network layer as much as possible.

Figure 4A:
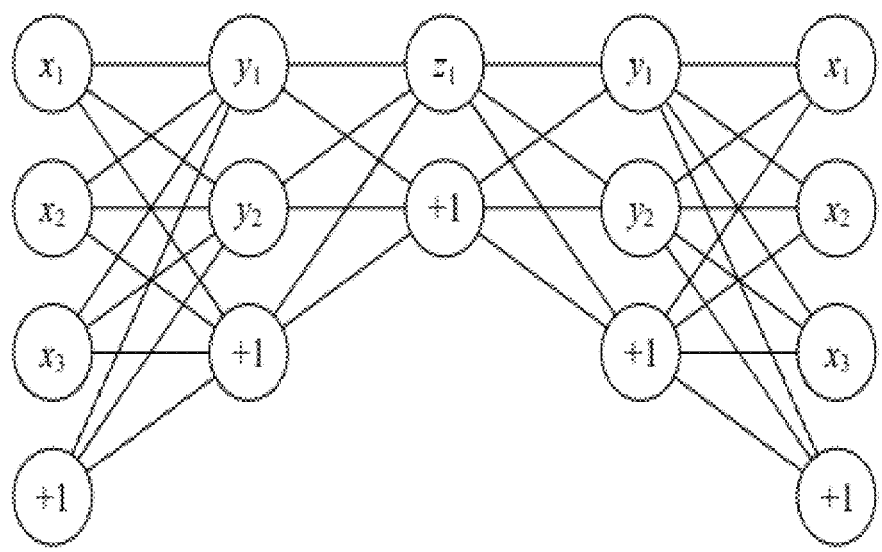
FIGS. 4A and 4B show schematic diagrams of a neural network structure according to some embodiments of the present disclosure.
Figure 4B:
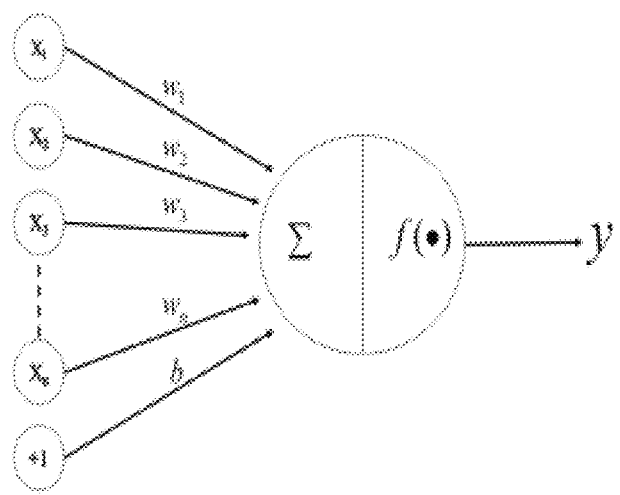

Refer to FIGS. 4A and 4B, which show schematic diagrams of a neural network structure according to some embodiments of the present disclosure.

As shown in FIGS. 4A and 4B, the unsupervised learning for the neural network structure may be implemented based on a neural network structure for pre-training. The pre-training structure may include a plurality of front neural network layers and a plurality of back neural network layers. Dimensions of the plurality of front neural network layers are reduced layer by layer, and dimensions of the plurality of back neural network layers are increased layer by layer, so that the first front neural network layer and the last back neural network layer have the same dimensions, which facilitate the unsupervised learning.

The neural network structure for pre-training may include a multi-layer restricted Boltzmann machine (RBM) neural network. Each neural network layer may include at least one mutually independent neuron. Each neuron is adapted to calculate the corresponding output information $y_j$ according to its input information $x_i$ and synaptic weight $w_i$, that is, $y_j = f(\Sigma_{i=1}^{n} w_i x_i + b)$. In the formula, $f(x)$ is a node function of the neuron. After that, each neuron can input its output information to each neuron of the next neural network layer to calculate the next neural network layer. In some embodiments, the output information $y_j$ of each neuron may also be a continuous nonlinear function of its input information $x_i$ and synaptic weight $w_i$.

It is understandable that this neural network structure can simulate the operating mode of the human brain, and a large-scale parallel distributed processor composed of simple processing units acquires knowledge from the external environment through the learning process and obtains reasonable output based on data not encountered in learning.

During pre-training of the unsupervised learning, the trainer of the yield prediction model may use sample defect data of a plurality of semiconductor device samples as input information of the first front neural network layer of the pre-training structure, and the trainer may use the same as output information of the last back neural network layer of the pre-training structure, so as to train the synaptic weight $w_i$ of each neuron according to the input information and output information of each neuron of each neural network layer, and train each neural network layer without supervision. Through this unsupervised training, the model can learn inherent correlation and features of the samples, and ensure that each neural network layer maps feature information to the next neural network layer as much as possible, so that the input information of the entire yield prediction model is distributed according to the probability closest to the original input, thereby improving the accuracy of yield prediction.

In some embodiments, after the pre-training of the unsupervised learning is completed, the trainer of the yield prediction model may remove all the back neural network layers of the pre-training structure, and use the plurality of remaining front neural network layers as the neural network structure of the yield prediction model. By means of pre-training, the present disclosure can use the lowest mapping dimension to map feature information to the subsequent classification structure as much as possible, so that the classification structure can accurately and efficiently classify the input information.

Figure 5:
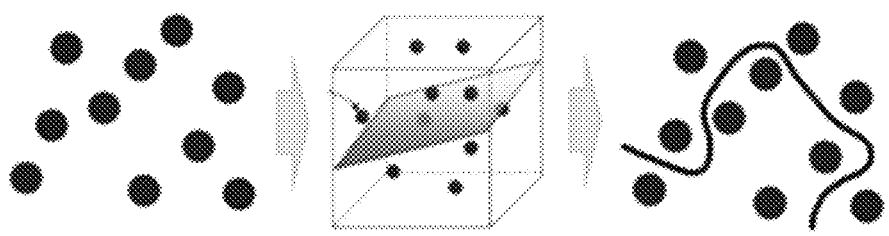
FIG. 5 shows a schematic diagram of classification using a support vector machine structure according to some embodiments of the present disclosure.

Refer to FIG. 5, which shows a schematic diagram of the classification structure using a support vector machine (SVM) structure according to some embodiments of the present disclosure.

As shown in FIG. 5, in some embodiments of the present disclosure, the classification structure may include a support vector machine (SVM) structure. The support vector machine structure is adapted to determine a hyperplane that can divide all data of the defect feature vectors $h_{w,b}(x)$, so that distances between two data points among all the data of the defect feature vectors $h_{w,b}(x)$ in the hyperplane are the shortest, and the defect feature vectors $h_{w,b}(x)$ are classified through the hyperplane. Specifically, first, both positive and negative samples X can be regarded as vectors, and the corresponding types C indicate +1 and −1 respectively. Then, the SVM structure can search a vector Z from the negative sample to the positive sample, so that the sum (x*z*c) of all the defect feature vectors $h_{w,b}(x)$ reaches a maximum value. Next, the support vector machine structure can use the hyperplane perpendicular to the vector Z to divide the positive and negative samples so as to realize the classification of the defect feature vectors $h_{w,b}(x)$.

In some embodiments, the SVM structure may include a layer of SVM network. The SVM network may be configured behind the last front neural network layer of the neural network structure to form the yield prediction model. The trainer of the yield prediction model may use the defect feature vector $h_{w,b}(x)$ outputted by the last neural network layer as input information of the SVM network, and use the sample yield data of the plurality of semiconductor device samples as output information of the SVM network, to reversely train the plurality of neural network layers of the neural network structure with supervision so as to finely adjust the pre-trained yield prediction model.

When the fine adjustment step is performed, feedback data of the SVM network can be reversed by the neural network structure, so that each neuron of the neural network can calculate a gradient between itself and an error surface weight, and the pre-trained yield prediction model is finely adjusted by calculating a gradient vector.

In some preferred embodiments, after the pre-training and fine adjustment of the yield prediction model are completed, the trainer of the yield prediction model may further optimize the pre-trained and finely adjusted yield prediction model according to a baseline fail bin count at a normal level of a long-term trend chart. Specifically, the trainer of the yield prediction model may set a normal-abnormal specification according to the baseline fail bin count at the normal level of the long-term trend chart, and compare the sum of defects of each semiconductor device sample outputted by the yield prediction model with the corresponding fail bin count. If the defect counts of a sample exceed about 60 ea (~30% total of defects) which is the baseline fail bin count, the trainer can determine that the semiconductor device sample (>60 ea is at an abnormal point. Correspondingly, the classification result corresponding to the output value is also an abnormal classification result. Next, the trainer of the yield prediction model may remove the defect data corresponding to the abnormal points from the sample defect data, and perform null filling on locations of the abnormal points with an average value of defects of the multiple lots of adjacent samples, so as to optimize the trained yield prediction model.

Further, the trainer of the yield prediction model may count the accuracy rate, detection rate and error report rate of abnormal points outputted by the yield prediction model according to whether the sum of defects outputted by the yield prediction model exceeds about 60 per sample up to 30% more to about 80 per sample at the baseline fail bin count. The accuracy rate indicates a proportion of correct results outputted by the yield prediction model, that is, (TN+TP)/(TN+FP+FN+TP), where TN is the number of outputting normal points T, as normal points T, FP is the number of outputting normal points T as abnormal points F, FN is the number of outputting abnormal points F as normal points T, and TP is the number of outputting abnormal points F as abnormal points F. The detection rate indicates a proportion of abnormal points successfully verified by the yield prediction model, that is, TP/(FN+TP). The error report rate indicates a proportion that the yield prediction model verifies normal points T as abnormal points F that is, FP/(FP+TN).

Next, the trainer of the yield prediction model may adjust a penalty coefficient C, a gamma value and/or a weight of the SVM structure according to the accuracy rate, detection rate and error report rate of abnormal points outputted by the yield prediction model to further optimize the yield prediction model, so as to further improve the accuracy of yield prediction. In some embodiments, the penalty coefficient C, the gamma value, and the weight parameter can be configured in a model code of the yield prediction model for the trainer to modify at will. For example, when some accidental factors cause some accidental "wrong" data in the samples, the trainer of the yield prediction model may adjust the over-fitting problem of the yield prediction model by adjusting the penalty coefficient C and the gamma parameter. For another example, when the number of negative samples in the yield prediction model is too small, that is, there are fewer wafers with low yield, the trainer may solve the problem of uneven samples by increasing weights of the negative samples.

Figure 6:
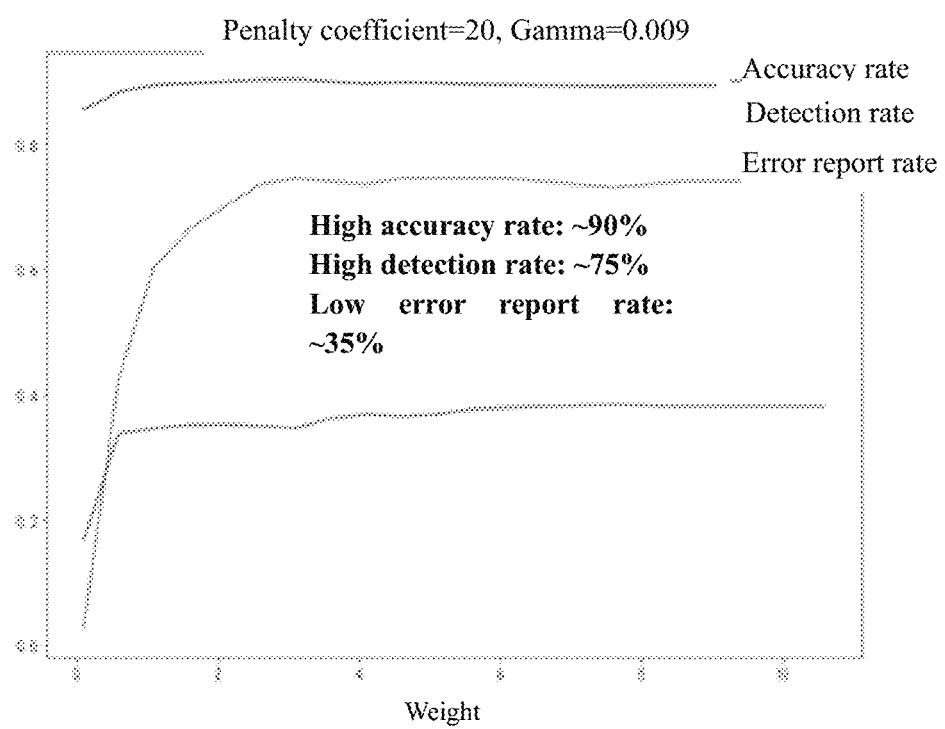
FIG. 6 is a chart showing calculated accuracy rate, detection rate, and error report rate of an optimized yield prediction model according to some embodiments of the present disclosure.

Refer to Table 1 below and FIG. 6. Table 1 shows comparison data information of the optimized yield prediction model according to some embodiments of the present disclosure. FIG. 6 shows a chart of the accuracy rate, detection rate, and error report rate of an optimized yield prediction model according to some embodiments of the present disclosure.

TABLE 1

| Item/Edition | First edition | Second edition | Third edition | Fourth edition |
|---|---|---|---|---|
| Data source | 0025D | 0025D | 0025D | 55LP platform product |
| Input level | Wafer level | Wafer level | Wafer level | Lot level |
| Input wafer | All scanned wafers | #1, 24 review | #1, 24 review | All wafers |
| Input item | Total count | Key layer Killer defect | Key layer Killer defect | Key layer Killer defect |
| Input content | Defect density | Defect density | Defect density | Sum of defects |
| Null filling rule | Average value of the entire layer | Average value of the entire layer | Average value of killer defects of adjacent lots/wafers within a period of time | Average value of defects of adjacent lots within a period of time after abnormal points are removed |
| Detection rate/error report rate | Low/high | Low/high | Low/high | High/moderate |

As shown in Table 1, by removing the defect data corresponding to the abnormal points in the sample defect data and performing null filling on locations of the abnormal points with the average value of defects of adjacent samples of multiple lots, the optimized yield prediction model can obtain a high detection rate and control the error report rate in a moderate range.

As shown in FIG. 6, by further optimizing and adjusting the penalty coefficient C, gamma value and weight of the support vector machine structure (for example: assuming the penalty coefficient C=20, gamma=0.009, weight=3), the optimized yield prediction model can obtain a detection rate of about 75% and control the error report rate at 35% while keeping the accuracy rate above 90%.

As shown in FIG. 1, the method for predicting the yield of manufacturing semiconductor devices according to the present disclosure may further include step 103: determining, by the yield prediction model, classification results of qualified or unqualified yield of the semiconductor devices.

After the training of the yield prediction model is completed using the training method provided in the foregoing embodiment, a yield predicting apparatus loaded with the yield prediction model can be put into actual yield prediction applications of semiconductor devices.

As described above, the pre-trained yield prediction model may include a neural network structure and a classification structure. In some embodiments, the neural network structure may include a plurality of neural network layers. Each neural network layer may include at least one mutually independent neuron. The plurality of neural network layers reduces dimensions layer by layer, and can be trained without supervision by using the pre-training structure shown in FIGS. 4A and 4B to ensure that each neural network layer can map feature information to a next neural network layer as much as possible.

When the yield classification results of the semiconductor devices are determined using the yield prediction model, the processor of the yield predicting apparatus may first input the defect data of the semiconductor devices to be predicted into the first neural network layer of the neural network structure. Neurons of the first neural network layer can respectively calculate corresponding output information $y_1 \sim y_2$ according to the input defect data $x_1 \sim x_3$ and the pre-trained synaptic weights $w_1 \sim w_3$ and b, and input the output information $y_1 \sim y_2$ to neurons of the second neural network layer. By the unsupervised training of the synaptic weights $w_1 \sim w_3$ and b, the first neural network layer can reduce dimensions of the input defect data, and map feature information to the second neural network layer as much as possible.

By analogy, the neural network structure can have the lowest output dimension at the back end of the last neural network layer, and the defect feature vector $h_{w,b}(x)$ closest to the probability distribution of the original input. It is understandable that this neural network structure can simulate the operating mode of the human brain, and a large-scale parallel distributed processor composed of simple processing units acquires knowledge from the external environment through the above-mentioned learning process of sample defect data, and then outputs reasonable defect feature vectors $h_{w,b}(x)$ according to the defect data, not encountered in learning, of the semiconductor devices to be predicted.

Subsequently, the processor of the yield predicting apparatus may input the defect feature vectors $h_{w,b}(x)$ outputted by the last neural network layer into the classification structure, so as to determine, by the classification structure, whether the yield of the semiconductor devices is qualified.

As described above, in some embodiments, the classification structure may include a support vector machine (SVM) structure. The processor of the yield predicting apparatus may use the support vector machine structure to determine a hyperplane that can divide all data of defect feature vectors $h_{w,b}(x)$, so that distances between all the data of the defect feature vectors $h_{w,b}(x)$ and the hyperplane are the shortest, and the defect feature vectors $h_{w,b}(x)$ are classified through the hyperplane.

Specifically, the support vector machine structure may include a layer of SVM network. The SVM network may be configured behind the last neural network layer of the neural network structure to form the yield prediction model. As described above, the SVM network can be used to reversely train the plurality of neural network layers of the neural network structure with supervision, and finely adjust the yield prediction model to improve the accuracy of yield prediction. The processor of the yield predicting apparatus may input the defect feature vectors $h_{w,b}(x)$ outputted by the last neural network layer into the SVM network, so as to determine, by the SVM network, the classification results of qualified or unqualified yield of the semiconductor devices.

As mentioned above, in some preferred embodiments, the trainer of the yield prediction model may further determine abnormal points in the sample defect data according to a baseline fail bin count at a normal level of a long-term trend chart so as to remove these abnormal points, and perform null filling on locations of the abnormal points based on an average value of defects of multiple lots of adjacent samples to optimize the yield prediction model. Correspondingly, the processor of the yield predicting apparatus may input the defect data of the semiconductor devices to be predicted into the optimized yield prediction model, so as to determine the classification results by the optimized yield prediction model.

In some more preferred embodiments, the optimized yield prediction model may further determine the classification results according to the optimized penalty coefficient, gamma value, and/or weight. As mentioned above, the optimized penalty coefficient, gamma value and weight may be adjusted by the accuracy rate, detection rate and error report rate of abnormal points outputted by the yield prediction model. The specific adjustment method is described above, and details are not described herein again.

Based on the above description, the method for predicting the yield of manufacturing semiconductor devices according to the present disclosure includes a model combining a neural network structure and an SVM algorithm. By training weights between neurons in the neural network structure to learn the inherent correlation and features of samples, the present disclosure can allow the entire model to generate training data according to the probability distribution closest to the original input. Through the unsupervised learning, the present disclosure can use the SVM algorithm to find a hyperplane in the space that can divide all data samples, so as to realize the classification determination of whether the yield is qualified. The training process of the yield prediction model according to the present disclosure does not require excessive human intervention, and therefore, has good application prospects. The above-mentioned yield predicting method provided by the present disclosure can effectively predict the yield and various bin losses related to defect fail.

Although the above-mentioned methods are illustrated and described as a series of operations to simplify the explanation, it should be understood and appreciated that these methods are not limited by the order of the operations, because according to one or more embodiments, some operations may occur in a different order and/or occur concurrently with other operations that come from the illustrations and descriptions herein or that are not illustrated and described herein but can be understood by those skilled in the art.

Figure 7:
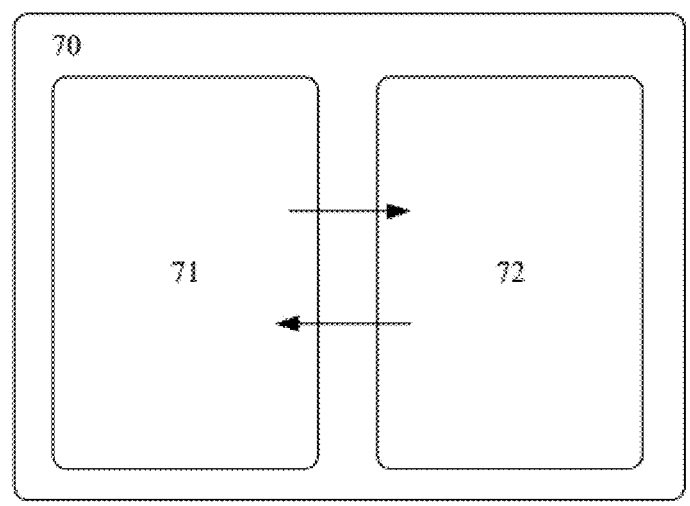
FIG. 7 shows a schematic structural diagram of an apparatus for predicting the yield of manufacturing semiconductor devices according to another aspect of the present disclosure.

According to another aspect of the present disclosure, an apparatus for predicting the yield of manufacturing semiconductor devices is further provided herein. Refer to FIG. 7, which shows a schematic structural diagram of an apparatus for predicting the yield of manufacturing semiconductor devices according to another aspect of the present disclosure.

As shown in FIG. 7, the apparatus 70 for predicting the yield of manufacturing semiconductor devices according to the present disclosure includes a memory 71 and a processor 72. The processor 72 is connected to the memory 71 and is configured to implement the method for predicting the yield of manufacturing semiconductor devices according to any one of the above embodiments, so as to accurately and efficiently predict the defects and yield of the manufacturing process of the semiconductor devices.

According to another aspect of the present disclosure, a computer-readable storage medium is further provided herein.

The computer-readable storage medium according to the present disclosure stores computer instructions thereon. The computer instructions are executed by the processor 72 to implement the method for predicting the yield of manufacturing semiconductor devices according to any one of the above embodiments, so as to accurately and efficiently predict the defects and yield of the semiconductor devices.

Those skilled in the art will understand that information, signals, and data can be represented by any of a variety of different technologies and techniques. For example, the data, instructions, commands, information, signals, bits, code elements, and chips quoted throughout the above description may be represented by voltage, current, electromagnetic waves, magnetic fields or magnetic particles, light fields or optical particles, or any combination thereof.

Those skilled in the art will further understand that the various illustrative logic blocks, modules, circuits, and algorithm steps described in conjunction with the embodiments disclosed herein may be implemented as electronic hardware, computer software, or a combination of the two. In order to clearly explain the interchangeability of hardware and software, various illustrative components, blocks, modules, circuits, and steps are generally described above in terms of their functionality. Whether such functionality is implemented as hardware or software depends on the specific application and the design constraints imposed on the overall system. Technicians can implement the described functionality in different ways for each specific application, but such implementation decisions should not be interpreted as departing from the scope of the present disclosure.

The various illustrative logic modules and circuits described in conjunction with the embodiments disclosed herein may be implemented or executed by general-purpose processors, digital signal processors (DSP), application-specific integrated circuits (ASIC), field programmable gate arrays (FPGA) or other programmable logic devices, discrete gate or transistor logics, discrete hardware components, or any combination thereof designed to perform the functions described herein. The general-purpose processor may be a microprocessor, but in alternative schemes, the processor may be any conventional processor, controller, microcontroller, or state machine. The processor may also be implemented as a combination of computing devices, such as a combination of a DSP and a microprocessor, a plurality of microprocessors, one or more microprocessors cooperating with a DSP core, or any other such configuration.

The processor 72 described in the above embodiments may be implemented by a combination of software and hardware. However, it can be understood that the processor 72 may also be implemented in software or hardware alone. With regard to hardware implementation, the processor 72 may be implemented in one or more application-specific integrated circuits (ASIC), digital signal processors (DSP), programmable logic devices (PLD), field programmable gate arrays (FPGA), processors, controllers, micro controllers, microprocessors, other electronic devices for performing the above functions, or a selective combination of the above-mentioned devices. With regard to software implementation, the processor 72 may be implemented by independent software modules such as procedures and functions running on a general-purpose chip, each of which can execute one or more functions and operations described herein.

The previous description of the present disclosure is provided to enable any person skilled in the art to make or use the present disclosure. Various modifications to the present disclosure will be obvious to those skilled in the art, and the general principles defined herein can be applied to other variations without departing from the spirit or scope of the present disclosure. Therefore, the present disclosure is not intended to be limited to the examples and designs described herein, but should be granted the widest scope consistent with the principles and novelty features disclosed herein.

What is claimed is:

1. A method for predicting yield of manufacturing semiconductor devices, comprising:
    acquiring defect data of the semiconductor devices, wherein the semiconductor devices comprise finished semiconductor devices and semi-finished semiconductor devices, and wherein the defect data indicates a defect type and a location of at least one defect of the semiconductor devices;
    inputting the defect data into a pre-trained yield prediction model, wherein the yield prediction model comprises a neural network structure and a classification structure, wherein the neural network structure extracts defect feature vectors from the defect data, wherein the defect feature vectors define qualified or unqualified yield, and wherein the classification structure sort out classification results of the qualified or the unqualified yield; and
    outputting, by the yield prediction model, the classification results of qualified or unqualified yield of the semiconductor devices.

2. The yield predicting method of claim 1, further comprising steps of:
    providing a plurality of semiconductor device test samples;
    acquiring sample defect data and sample yield data of the plurality of semiconductor device test samples, wherein the sample defect data comprises a defect type and location of at least one defect of the plurality of semiconductor device test samples, and the sample yield data indicates whether a yield of the plurality of semiconductor device test samples is qualified; and
    training the yield prediction model with the sample defect data as input information and the sample yield data as output information.

3. The yield predicting method of claim 2, wherein the training the yield prediction model comprises:
    training each neural network layer of a pre-training structure without supervision, using the sample defect data of the plurality of semiconductor device test samples as the input information of a first neural network layer of the pre-training structure and output information of a last neural network layer of the pre-training structure, wherein each said neural network layer maps feature information to a next neural network layer as much as possible; and
    removing at least the last neural network layer of the pre-training structure to obtain the neural network structure, wherein the neural network structure comprises a plurality of neural network layers.

4. The yield predicting method of claim 3, wherein each one of the plurality of neural network layers comprises at least one mutually independent neuron, wherein each neuron is adapted to calculate corresponding output information according to its input information and synaptic weight and input the output information to each neuron of a next one of the plurality of neural network layers, wherein the output information is a continuous nonlinear function of the input information and the synaptic weight; and
wherein the training each neural network layer of the pre-training structure comprises:
training the synaptic weight of each neuron according to the input information and output information of the neuron of each one of the plurality of neural network layers to train the neural network.

5. The yield predicting method of claim 3, wherein the pre-training structure comprises a plurality of front neural network layers and a plurality of back neural network layers, wherein dimensions of the plurality of front neural network layers are reduced layer by layer, dimensions of the plurality of back neural network layers are increased layer by layer, and wherein a step of obtaining the neural network structure comprises:
removing the plurality of back neural network layers of the pre-training structure, and using the plurality of front neural network layers as the neural network structure.

6. The yield predicting method of claim 2, wherein the classification structure comprises a support vector machine (SVM) structure, wherein the SVM structure is adapted to determine a hyperplane that can divide all data of the defect feature vectors, so as to realize a classification of the defect feature vectors, wherein the hyperplane makes a distance between each of all the data of the defect feature vectors and the hyperplane a shortest.

7. The yield predicting method of claim 6, wherein the SVM structure comprises an SVM network, wherein the SVM network is configured behind a last neural network layer of the neural network structure to form the yield prediction model, and wherein the training the yield prediction model further comprises:
reversely training the plurality of neural network layers of the neural network structure with supervision, using the defect feature vectors outputted by the last neural network layer of the neural network structure as input information of the SVM network and the sample yield data as output information of the SVM network, to finely adjust the yield prediction model.

8. The yield predicting method of claim 7, wherein the training the yield prediction model further comprises:
determining abnormal points outputted by a finely adjusted yield prediction model according to a baseline fail bin count at a normal level of a long-term trend chart;
removing data of the abnormal points from the sample defect data, and performing null filling on data locations of the abnormal points with an average value of defects of multiple lots of adjacent samples; and
adjusting a penalty coefficient, a gamma value, and/or a weight of the support vector machine structure according to the accuracy, detection rate and error report rate of the abnormal points to optimize the yield prediction model.

9. The yield predicting method of claim 2, wherein the acquiring sample defect data of the plurality of semiconductor device test samples comprises:
screening multiple lots of semiconductor device test samples on a production line according to a key layer to select multiple lots of typical semiconductor device test samples, wherein the key layer is determined by a location of at least one defect that has a high yield influencing weight, wherein each lot of the multiple lots of semiconductor device test samples comprises a plurality of wafers, wherein each of the plurality of wafers comprises a multi-layer structure;
screening the multiple lots of typical semiconductor device test samples to select a plurality of typical wafers;
performing defect analysis on the plurality of typical wafers to determine at least one defect of each typical wafer; and
counting a defect type and location of the at least one defect of each typical wafer, to determine the sample defect data of the multiple lots of typical semiconductor device test samples.

10. The yield predicting method of claim 9, wherein the acquiring sample defect data of the plurality of semiconductor device test samples further comprises:
screening defects of the multiple lots of semiconductor device test samples according to yield influencing weights of defects of various defect types to determine types of killer defects;
screening the defects of the multiple lots of semiconductor device test samples according to the yield influencing weights of defects at respective locations to determine the key layer; and
screening the sample defect data of the multiple lots of semiconductor device test samples according to the types of killer defects and the key layer to determine optimized sample defect data.

11. The yield predicting method of claim 9, further comprising:
in response to missing sample defect data of any semiconductor device sample, calculating an average value of the sample defect data of multiple adjacent layers during performing missing data optimization algorithm on the missing sample defect data, wherein the multiple adjacent layers comprise temporal adjacent layers and location adjacent layers.

12. The yield predicting method of claim 1, wherein the neural network structure comprises a plurality of neural network layers, wherein each of the plurality of neural network layers is trained without supervision to ensure that feature information is mapped to a next neural network layer of the neural network structure as much as possible; and
wherein the step of determining the classification results comprises:
inputting the defect data of the semiconductor devices to the first neural network layer of the neural network structure;
mapping feature information of the defect data to the next neural network layer as much as possible by the first neural network layer, and sequentially mapping the feature information backwards till the last neural network layer of the neural network structure; and
inputting the defect feature vectors outputted by the last neural network layer to the classification structure to determine the classification results by the classification structure.

13. The yield predicting method of claim 12, wherein each neural network layer of the neural network structure comprises at least one mutually independent neuron, and wherein the step of mapping the defect data to the next neural network layer comprises:
- calculating output information of each neuron according to input information and synaptic weight of each neuron of the current neural network layer, wherein the output information is a continuous nonlinear function of the input information and synaptic weight of the corresponding neuron; and
- inputting the output information of each neuron to each neuron of the next neural network layer to map the defect data backwards.

14. The yield predicting method of claim 12, wherein dimensions of the plurality of neural network layers of the neural network structure are reduced layer by layer;
wherein the step of inputting the defect feature vectors to the classification structure further comprises:
- inputting lowest-dimensional defect feature vectors outputted by the last neural network layer to the classification structure.

15. The yield predicting method of claim 1, wherein the classification structure comprises a support vector machine structure; and
wherein the step of determining the classification results comprises:
determining, by the support vector machine structure, a hyperplane that can divide all data of the defect feature vectors, to realize a classification of the defect feature vectors, wherein the hyperplane makes a distance between each of all the data of the defect feature vectors and the hyperplane a shortest.

16. The yield predicting method of claim 15, wherein the SVM structure comprises an SVM network; wherein the SVM network is configured behind the last neural network layer of the neural network structure to form the yield prediction model, for reversely training the plurality of neural network layers of the neural network structure with supervision to finely adjust the yield prediction model; and
wherein the step of determining the classification results further comprises:
- inputting the defect feature vectors outputted by the last neural network layer to the SVM network, so as to determine the classification results of qualified or unqualified yield of the semiconductor devices by the SVM network.

17. The yield predicting method of claim 16, wherein the step of determining the classification results further comprises:
- inputting the defect feature vectors to an optimized yield prediction model, so as to determine the classification results by the optimized yield prediction model according to an optimized penalty coefficient, gamma value and/or weight, wherein the optimized yield prediction model is optimized according to abnormal points determined by a baseline fail bin count at a normal level of a long-term trend chart, and the optimized penalty coefficient, gamma value and/or weight are adjusted according to an accuracy rate, a detection rate and an error report rate of the abnormal points outputted by the yield prediction model.

18. An apparatus for predicting the yield of manufacturing semiconductor devices, comprising:
- a memory; and
- a processor, wherein the processor is connected to the memory and is configured to implement the method for predicting the yield of manufacturing semiconductor devices according to claim 1.

19. A non-transitory computer-readable storage medium, storing computer instructions thereon, wherein the computer instructions are executed by a processor to implement the method for predicting the yield of manufacturing semiconductor devices according to claim 1.

\* \* \* \* \*